United States Patent
Aleksov et al.

(10) Patent No.: US 9,564,408 B2
(45) Date of Patent: Feb. 7, 2017

(54) SPACE TRANSFORMER

(71) Applicant: Intel Corporation, Santa Clara, CA (US)

(72) Inventors: Aleksandar Aleksov, Chandler, AZ (US); Johanna M. Swan, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/229,405

(22) Filed: Mar. 28, 2014

(65) Prior Publication Data

US 2015/0279774 A1    Oct. 1, 2015

(51) Int. Cl.
*H01L 23/49*    (2006.01)
*H01L 23/00*    (2006.01)
(Continued)

(52) U.S. Cl.
CPC ........... *H01L 24/11* (2013.01); *H01L 21/4853* (2013.01); *H01L 21/4857* (2013.01);
(Continued)

(58) Field of Classification Search
CPC .................. H01L 2224/16625; H01L 2924/00; H01L 2924/15311; H01L 23/49822; H01L 23/49816; H05K 1/115
See application file for complete search history.

(56) References Cited

U.S. PATENT DOCUMENTS

2004/0155357 A1* 8/2004 Ho .................. H01L 21/4857
257/778
2006/0163743 A1* 7/2006 Kuwabara ............ H01L 21/288
257/773
(Continued)

FOREIGN PATENT DOCUMENTS

JP    2009059822    3/2009
WO   WO-2010047228    4/2010

OTHER PUBLICATIONS

Intel Corporation, "Final Office Action", JP Application No. 2015-026002, (Jul. 26, 2016).
(Continued)

*Primary Examiner* — Whitney T Moore
*Assistant Examiner* — Joseph Galvin, III
(74) *Attorney, Agent, or Firm* — Blakely, Sokoloff, Taylor & Zafman LLP

(57) ABSTRACT

An apparatus including a planar semiconductor substrate including a plurality of devices and a first pattern of electrical contacts formed on the first surface of the semiconductor substrate; and a plurality of layers of conductive material alternating between dielectric material on the first surface of the semiconductor substrate, the plurality of layers of conductive material including a wiring layer including a second pattern of electrical contacts, wherein the second surface of the semiconductor substrate includes openings to the first pattern of electrical contacts. A method including forming a space transformer including a semiconductor substrate including, on a device side, a device region, (Continued)

a first pattern of electrical contacts, and at least one routing layer and a pad layer including a second pattern of electrical contacts; and forming openings through the space transformer to the first pattern of electrical contacts on the semiconductor substrate.

22 Claims, 7 Drawing Sheets

(51) Int. Cl.
    *H01L 23/498*    (2006.01)
    *H01L 21/48*     (2006.01)

(52) U.S. Cl.
    CPC .. *H01L 23/49816* (2013.01); *H01L 23/49822* (2013.01); *H01L 24/81* (2013.01); *H01L 23/49811* (2013.01); *H01L 2224/16225* (2013.01); *H01L 2224/81801* (2013.01); *H01L 2924/10253* (2013.01); *H01L 2924/14* (2013.01); *H01L 2924/181* (2013.01); *H01L 2924/2064* (2013.01)

(56) References Cited

U.S. PATENT DOCUMENTS

| | | | | |
|---|---|---|---|---|
| 2009/0160011 | A1* | 6/2009 | Park | H01L 23/5227 257/506 |
| 2011/0121444 | A1* | 5/2011 | Wu | H01L 23/49833 257/693 |
| 2013/0089701 | A1 | 4/2013 | Hooper et al. | |

OTHER PUBLICATIONS

Intel Corporation, "First Office Action", JP Application No. 2015-026002, (Mar. 1, 2016).
Intel Corporation, "Office action with search report", TW Application No. 104103468, (Feb. 24, 2016).

\* cited by examiner

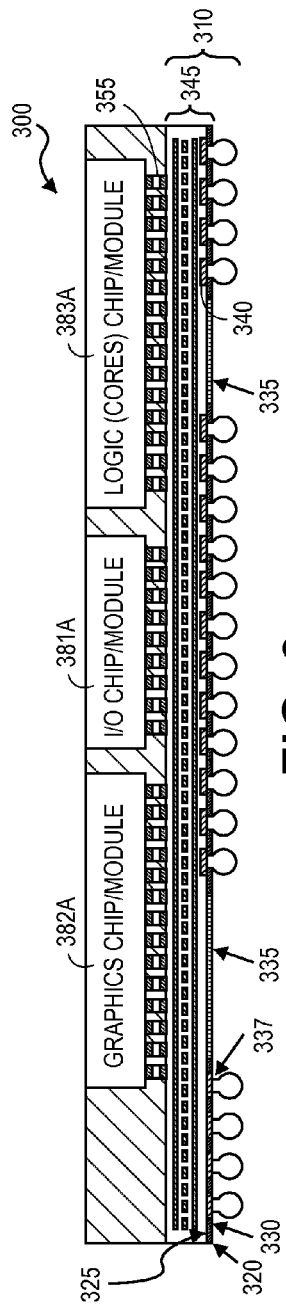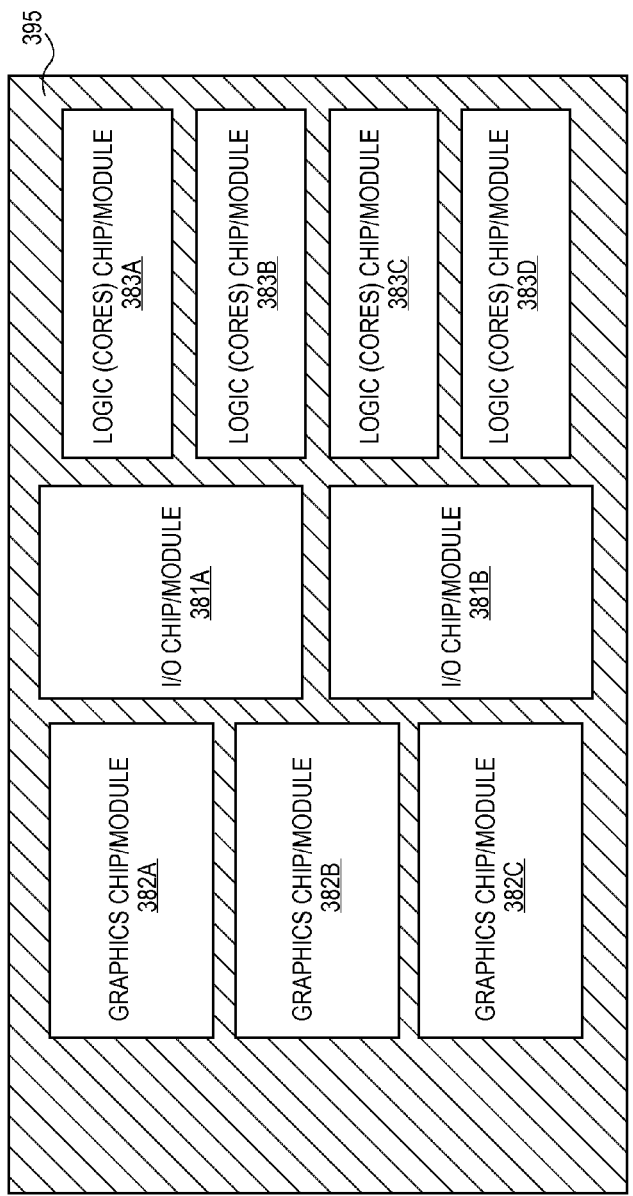

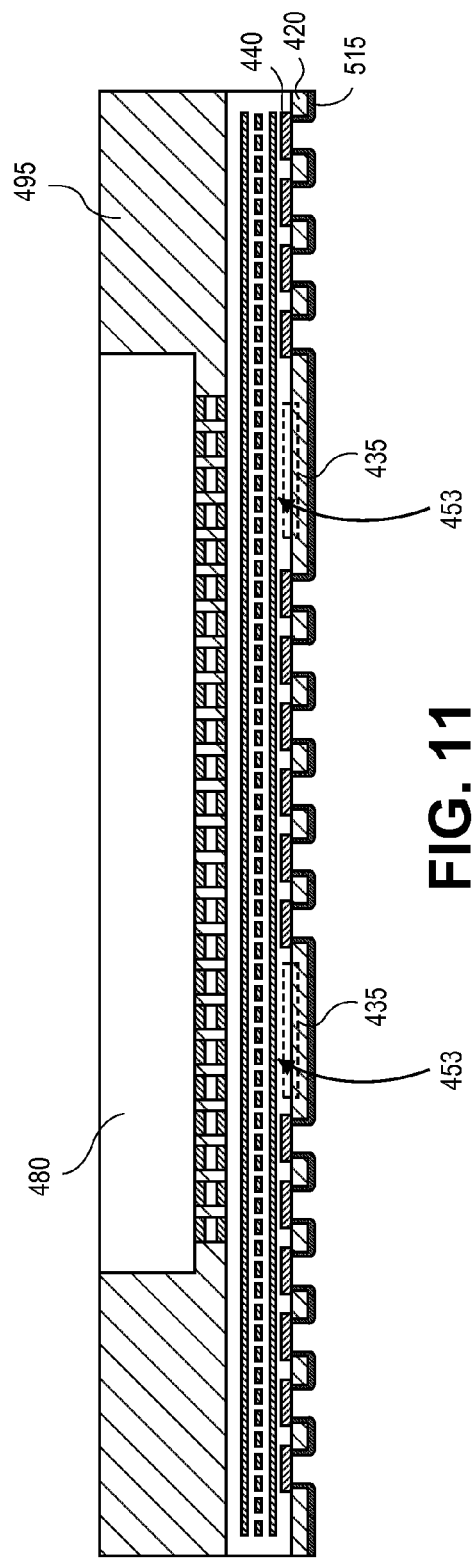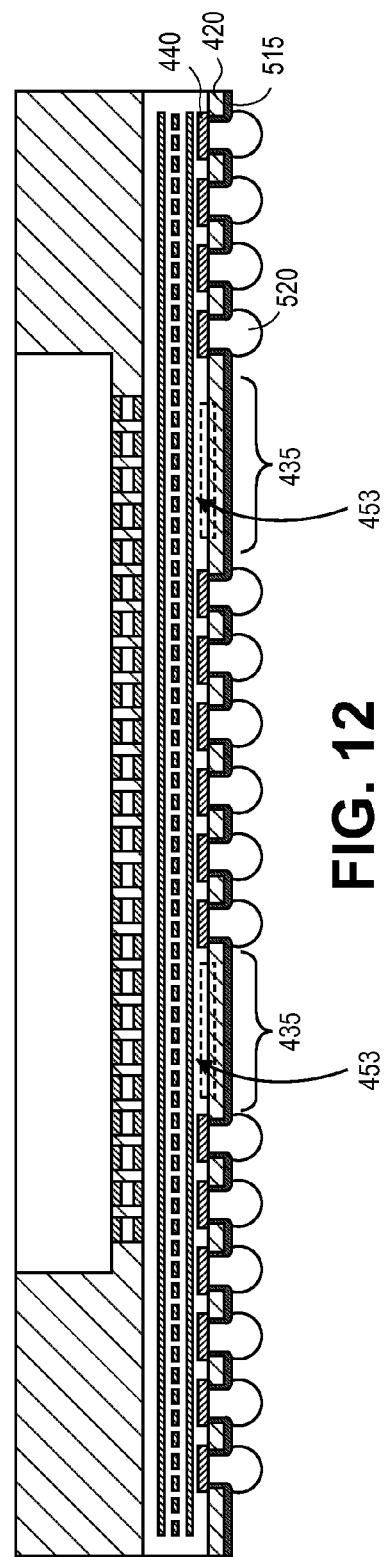

SPACE TRANSFORMER

FIELD

Die packaging.

BACKGROUND

The proliferation of systems on chips (requiring higher I/O count), increasing process cost per silicon unit area and the need for small form factor chips enabling the computer continuum require finer pitches and smaller packages. At the same time the mobile and ubiquitous segments require low cost solutions. Finer bump pitch generally requires expensive packages due to FLS processing while providing electro-migration capability and reliability of interconnects and package traces. An alternative expensive packaging technology is using an interposer (e.g., silicon or glass interposer) for fine pitch fan out to coarser pitches and LS and using through silicon vias (TSVs) to the package or board interconnects. TSVs, however, tend to add significant cost, limit or degrade power handling and signal integrity and add thickness.

BRIEF DESCRIPTION OF THE DRAWINGS

FIG. 3 shows a side view of another embodiment of an assembly including a space transformer and a multi-chip package assembly.

FIG. 4 shows a top view of the structure of FIG. 3 and shows dies are each I/O chip/module, graphics chip/module, and logic (cores) chip/module.

FIG. 11 shows the structure of FIG. 10 following the formation of openings through barrier layer material to contact pads.

FIG. 12 shows the structure of FIG. 11 following the introduction of solder connections to the contact pads.

DETAILED DESCRIPTION

An apparatus is disclosed. In one embodiment, an apparatus is operable as a space transformer and includes a planar semiconductor substrate including a plurality of devices formed in and/or on a device side of the semiconductor substrate and a first pattern of electrical contacts also formed on the device side of the semiconductor substrate. The apparatus also includes a plurality of layers of conductive material alternating between dielectric material on the device side of the semiconductor substrate. The plurality of layers of conductive material include a wiring layer including a second pattern of electrical contracts. A backside of the semiconductor substrate includes openings through the substrate to the first pattern of electrical contacts. As a space transformer, in one embodiment, a die or die is connected to one of the first pattern of electrical contacts and the second pattern of electrical contacts through, for example, solder connections. The other of the first pattern of electrical contacts and the second pattern of electrical contacts may be connected through, for example, solder connections to a substrate, such as a package substrate or a printed circuit board. A method of forming a space transformer and a die containing package is also disclosed.

Figure 1:
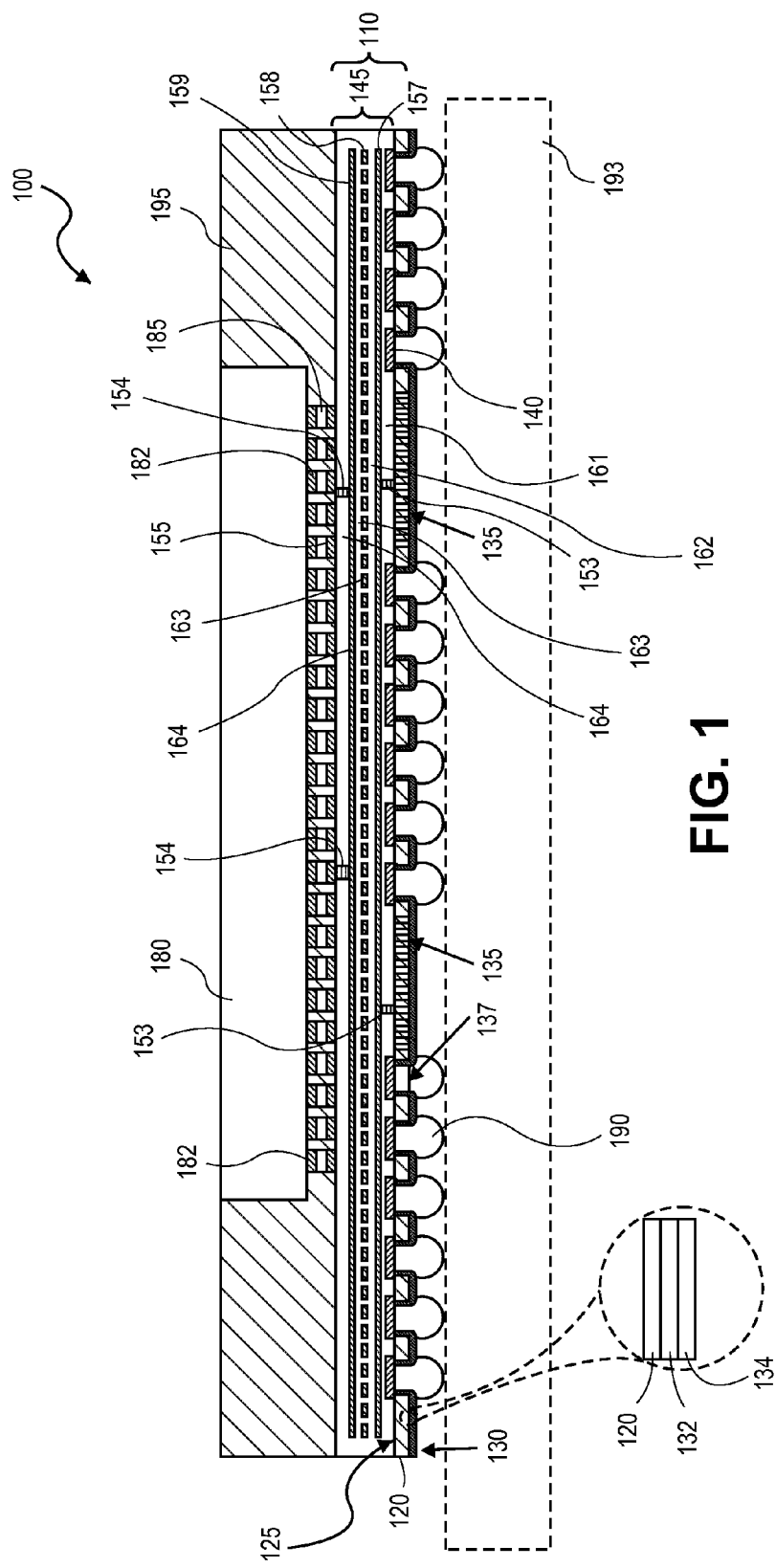
FIG. 1 shows a side view of an embodiment of an assembly including a space transformer.

FIG. 1 shows a side view of an embodiment of an assembly including a space transformer. Referring to FIG. 1, assembly 100 includes space transformer 110 including semiconductor substrate 120. Semiconductor substrate 120 includes device side 125 and backside 130 opposing device side 125. Device side 125 includes active device or circuitry region 135 including, for example, components such as transistors and interconnects that are tailored to tasks such as high speed input/output (I/O), radio frequency (RF) and/or power delivery, or repeaters for die-to-die productivity. Device side 125 also includes an interconnect stack including at least one routing layer (fan out metal layer), a via layer and a pattern of contacts 140 on a surface of semiconductor substrate 120.

Connected to device side 125 of semiconductor substrate 120 is build-up portion 145 of, in one embodiment, a plurality of layers of conductive material alternating between dielectric materials. FIG. 1 shows layers of conductive material including conductive material layer 157, conductive material layer 158 and conductive material layer 159. A surface of build-up portion 145 includes a pattern of contacts connected to one or more of conductive material layer 157, conductive material layer 158 and conductive material layer 159 and to contacts 140 through conductive vias. FIG. 1 shows representative conductive vias 154 between conductive material layer 159 and contacts 155. Active device/circuitry regions 135 and the devices/circuits are connected ultimately to die 180 by conductive vias (e.g., conductive vias 154) and one or more of conductive material layers (metal layers) 157-159. A portion of the contacts and vias to die 180 may also be through a conductive material layer(s) different than the conductive material layers illustrated in build-up portion 145. FIG. 1 illustratively shows conductive via 153 between active device/circuitry region 135 and such other conductive material layer(s). In one embodiment, each of conductive material layers 157-159 is, for example, a conductive material, while the conductive vias may be a copper, tungsten, gold or other metal suitable, for example, to contact semiconductor devices directly. Disposed between contact points 155 and the layers of conductive material and semiconductor substrate 120 in structure 100 of FIG. 1 are layers of dielectric material (dielectric layer 161, dielectric layer 162, dielectric layer 163 and dielectric layer 164, respectively).

FIG. 1 shows semiconductor substrate 120 having openings 137 from backside 130 through a thickness of the substrate to contacts 140. FIG. 1 shows solder balls 190 disposed through openings 137 to contacts 140. The solder connections (solder balls 190) are operable to connect assembly 100 to contacts of substrate 193 such as a package substrate or a printed circuit board. FIG. 1 also shows contacts 155 on an opposite side of space transformer 110 connected to die 180 that is, for example, a microprocessor or other die. In one embodiment, the connection of die 180 to contacts 155 is through solder connections 185. As illustrated, contacts 155 have a pitch similar to contacts 182 of die 180. Contacts 140 of space transformer 110 have a pitch to correspond with a pitch of substrate 193. In one embodiment, the pitch of contacts 140 is greater than a pitch of contacts 155 (contacts 155 are at a finer pitch than contacts 140). Surrounding die 180 on space transformer 110 is mold material 195 of, for example, an organic dielectric.

Referring to semiconductor substrate 120 of space transformer 110, in one embodiment, substrate 120 or a device layer or layers of substrate 120 is a single crystal silicon, silicon-germanium or a narrow band-gap semiconductor material such as indium arsenide (InAs), or indium antimony (InSb) (having a band gap that is comparatively smaller than a band gap of silicon). Active device/circuitry region 135 may contain integrated circuits that allow for supplying some or all necessary I/O function to die 180, RF/radio function, power delivery and repeater or die-to-die communication. Devices and circuits in active device/circuitry region 135 do not need to be manufactured in the same process as, for example, die 180 (e.g., a logic die). Accordingly, the device layers and dimensions can be tailored to fit specific functional needs. For example, power transistors in active device/circuitry region 135 can have specific gate dielectric thicknesses that may be not be compatible with conventional logic manufacturing processes. Also, additional capacitance needed for power delivery can be added. In another example, RF-transistors can have dimensions and structures (e.g., multi-gate-finger field effect transistors) tailored to have optimal characteristics for the intended RF frequencies and functions.

In one embodiment, in the case of semiconductor substrate 120 of silicon or silicon-germanium, device side 125 of semiconductor substrate includes barrier layer 132 of, for example, tantalum nitride (TaN) and/or dielectric layer 134 of, for example, silicon dioxide. Barrier layer 132 and/or dielectric layer 134 are introduced (e.g., via chemical vapor deposition) to a thickness in one aspect, to inhibit the diffusion of metal (e.g., copper) from contacts 140 into the semiconductor material and bump-to-bump electrical insulation. In an example where the semiconductor substrate is a narrow band-gap semiconductor where insulating or semi-insulating properties cannot be obtained (e.g., some Group III-V materials such as InAs and InSB), barrier layer 132 may be omitted and only dielectric layer 134 may be formed on the substrate.

Figure 2:
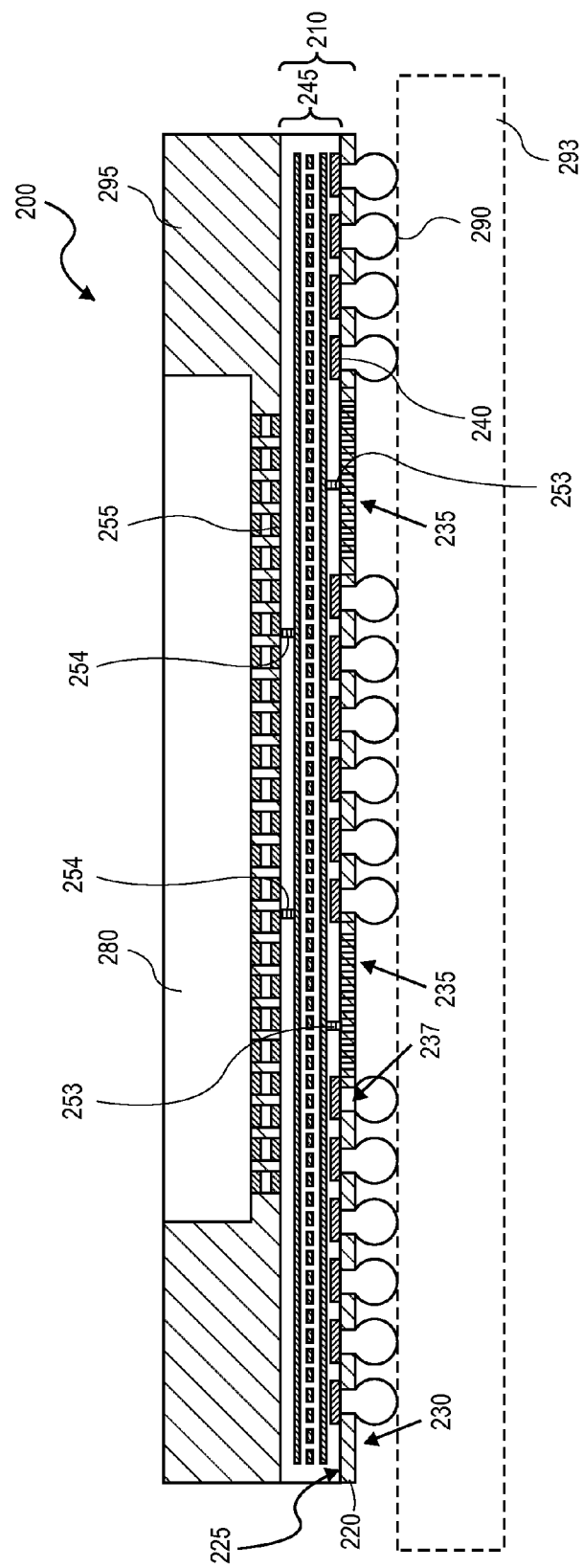
FIG. 2 shows a cross-sectional side view of another embodiment of an assembly including space transformer.

FIG. 2 shows a cross-sectional side view of another embodiment of an assembly including space transformer. Assembly 200 includes space transformer 210 including semiconductor substrate 220 having device side 225 and backside 230. Device side 225 includes active device/circuitry region 235 and contacts 240. Connected to device side 225 of semiconductor substrate is build-up layer 245 of a plurality of layers of conductive material alternating between layers of dielectric material. The plurality of layers of conductive material include a wiring layer including a pattern of electrical contacts 255 on a surface of build-up layer 245 (a surface of space transformer 210 opposite semiconductor substrate 220). Active device/circuitry region 235 and the devices associated with semiconductor substrate 220 are ultimately connected to die 180 by conductive vias (e.g., conductive vias 254 between contacts 255 and a layer of conductive material in build-up layer 245). A portion of the contacts and vias to die 280 may also be through conductive material layer(s) different than the conductive material layers illustrated in build-up layer 245. FIG. 2 illustratively shows conductive vias 253 between active device/circuitry region 235 and such other conductive material layer(s).

FIG. 2 shows openings 237 through semiconductor substrate 220 to contacts 240. The solder connections (solder balls 290) are disposed in openings 237 to contacts 240. The solder connections are operable to connect space transformer 210 to substrate 293 such as a package substrate or printed circuit board. Contacts 255 are operable to connect space transformer 210 to a die (a microprocessor die) or dies such as die 280 through, for example, solder connections. As illustrated in FIG. 2, contacts 255 have a finer pitch than contacts 240. FIG. 2 shows mold material 295 disposed on space transformer 210 surrounding die 280.

FIG. 2 illustrates an embodiment where semiconductor substrate 220 or a device layer(s) of semiconductor substrate 220 is a wide band-gap semiconductor material such as gallium nitride or other Group III-V nitride material or a narrow-gap material that can be made semi-insulating by, for example, appropriate doping, or insulating such as, for example, gallium arsenide, aluminum arsenide or gallium phosphide. Since these semiconductor materials are sufficiently insulating or entirely insulating in the case of wide band-gap materials, a barrier and/or insulation layer on semiconductor substrate may not be needed as indicated in FIG. 2.

FIG. 3 shows a side view of another embodiment of an assembly including a space transformer and a multi-chip package assembly. Assembly 300 includes space transformer 310 including semiconductor substrate 320 and build-up layers 345 disposed on a device side of semiconductor substrate 320. Semiconductor substrate 320 includes device side 325 including active device region 335 and a pattern of contacts 340 and backside 330. Openings 337 are made through semiconductor substrate 320 to contacts 340. Build-up layer 345 of alternating layers of conductive material and dielectric material is disposed on device side 325 of semiconductor substrate 320. An opposite side of build-up layer 345 includes contacts 355. Contacts 340 are operable to connect space transformer 310 to a substrate such as a package substrate or printed circuit board. Contacts 355, in this embodiment, are operable to connect space transformer 310 to multiple dies. FIG. 3 shows each of die 381A, 382A and 383A connected to contacts 355 through, for example, solder connections. Die 381A is, for example, an I/O chip/module; die 382A is, for example, a graphics chip/module; and die 383A is, for example, logic (cores) chip/module. The individual chips are embedded in mold compound 395 of, for example, an organic material. FIG. 4 shows a top view of the structure of FIG. 3 and shows dies 381A and 381B are each, for example, I/O chip/module; dies 382A, 382B and 382C are each graphics chip/module; and dies 383A, 383B, 383C and 383D are each logic (cores) chip/module.

FIG. 3 and FIG. 4 illustrate an embodiment where late binding may be achieved independent of the active circuitry in a space transformer. In one embodiment, active device/circuitry regions 335 of space transformer 310 may provide additional functionality such as power delivery, RF circuits, radios to the respective dice mounted on the space transformer.

Figure 5:
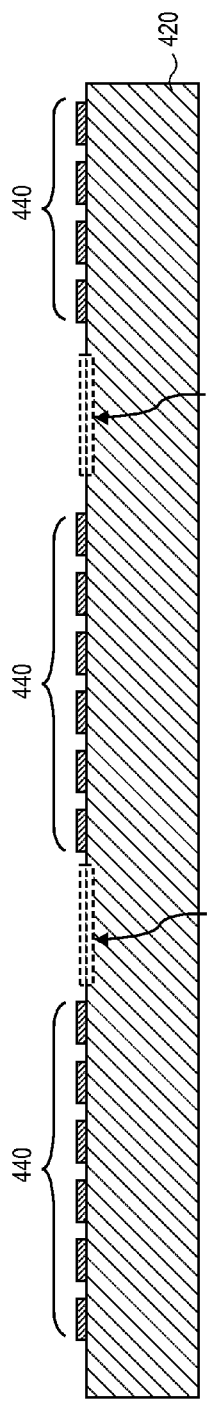
FIG. 5 illustrates the computing device in accordance with one implementation.

FIGS. 5-12 show an embodiment of a method for assembling a structure such as shown in FIG. 1. FIG. 5 shows a portion of a semiconductor substrate such as a wafer. Substrate 420 is, for example, a silicon wafer. On a device side of substrate 420, integrated circuit devices and circuits are formed in active device/circuitry regions 435 according to semiconductor processing techniques. Such devices and circuits (e.g., interconnects) may extend beyond the surface of the substrate. For example, gate and junction region (source region/drain region) metallization may be formed in a surface of a substrate. Additional metallization on a device side of semiconductor substrate may include an interconnect stack comprising at least one routing layer and a conductive via layer associated with active device/circuitry regions 435. Further interconnect on substrate 420 includes at least one routing layer and associated conductive vias for a pad layer including a pattern of contact pads 440.

Prior to forming active device/circuitry regions 435 or contact pads 440 in or on substrate 420, alternative semiconductor material may be introduced on the substrate. For example, where there is a desire to have a substrate device layer with a band gap different from that of silicon, such alternative material (e.g., germanium, Group III-V semiconductor, etc.) may be introduced, for example, in a graded fashion.

Figure 6:
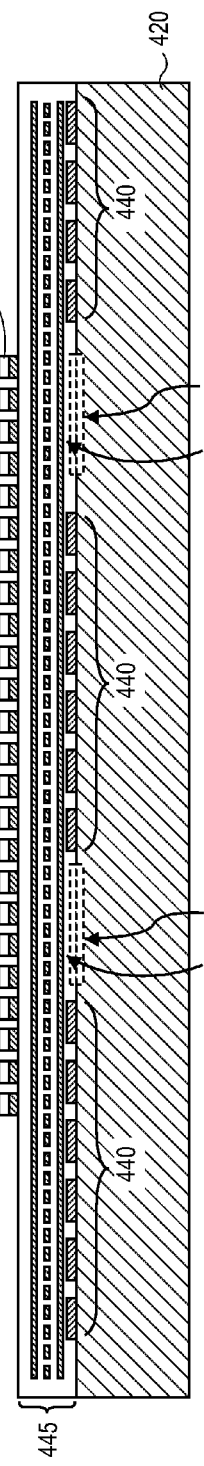
FIG. 6 shows the structure of FIG. 5 following the introduction of build-up layers on the structure.

FIG. 6 shows the structure of FIG. 5 following the introduction of build-up layers on the structure. Specifically, FIG. 6 shows build-up layers including layers of conductive material alternating between dielectric materials on a device side of semiconductor substrate 420. In one embodiment, such build-up layers will be formed according to semiconductor manufacturing techniques. Representatively, suitable dielectric material includes chemical vapor deposition (CVD) deposited silicon dioxide ($SiO_2$), silicon nitride ($Si_3N_4$) and dielectric material having a dielectric constant less than $SiO_2$ (a low k dielectric material). The conductive material and conductive via material is representatively a copper material deposited according to a dual- or single-damascene process. Although a conductive material of a copper material is disclosed for conductive via material, it is appreciated that such via material, particularly via material contacting devices in device/circuitry region 455, may be another material such as titanium, nickel, gold or tungsten introduced, for example, through a single damascene process. The number of layers of conductive material in build-up layer 445 can vary as desired. A superior layer of conductive material includes a pattern of contact pads 455 having a pitch corresponding to a contact pitch of a die. FIG. 6 shows die 480 connected to contact pads 455 through, for example, solder connections. FIG. 6 also shows conductive vias 453 between active device/circuitry region 435 and a conductive material layer of build-up layer 445.

Figure 7:
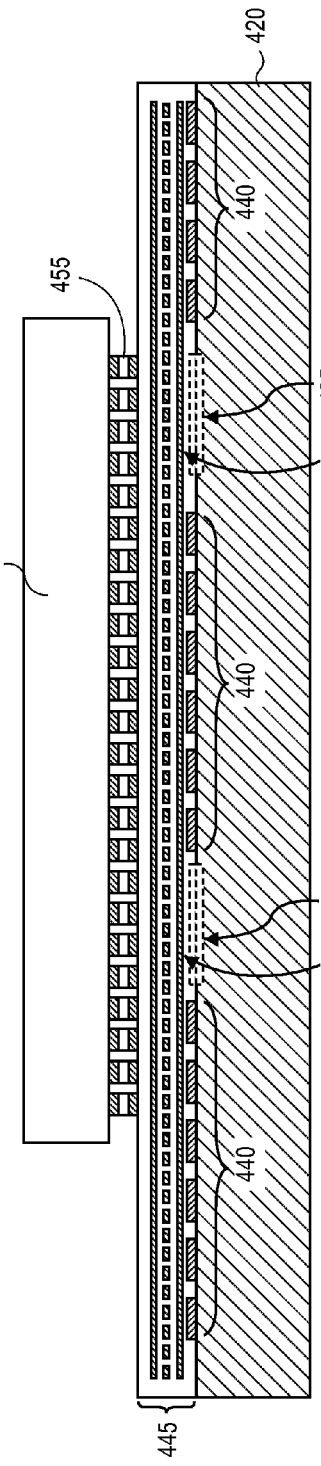
FIG. 7 shows the structure of FIG. 6 following the thinning of semiconductor substrate.

FIG. 7 shows the structure of FIG. 6 following the thinning of semiconductor substrate 420. In one embodiment, substrate 420 may be thinned by, for example, grinding the substrate down to the appropriate thickness by a mechanical grinding process. One representative thickness of substrate 420 is 25 μm or less. Other techniques including chemical mechanical polishing, wet etching and a plasma dry chemical etching.

Figure 8:
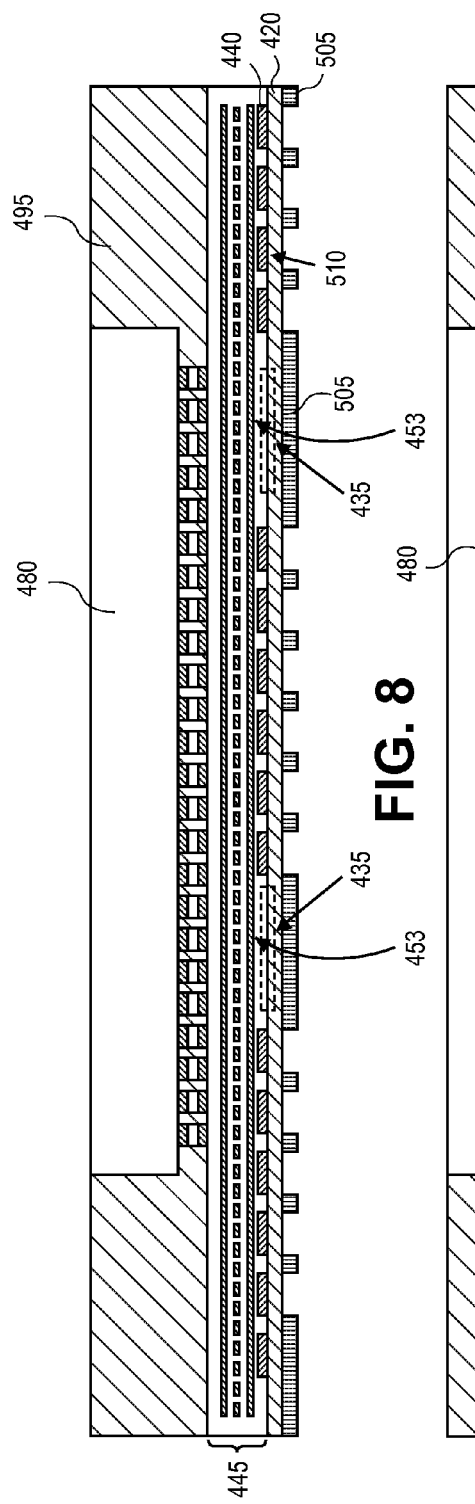
FIG. 8 shows the structure of FIG. 7 following the introduction of a molding material on the structure.

FIG. 8 shows the structure of FIG. 7 following the introduction of a molding material on the structure. Specifically, FIG. 8 shows molding material 495 of, for example, an organic polymer on a surface of build-up layer 445 and surrounding die 480. FIG. 8 also shows the structure after forming openings 510 through semiconductor substrate 420 in areas corresponding to contact pads 440. Specifically, FIG. 8 shows masking layer 505 of, for example, a photoresist having openings 510 to areas corresponding to location of contact pads 440 on an opposite side of semiconductor substrate 420.

Figure 9:
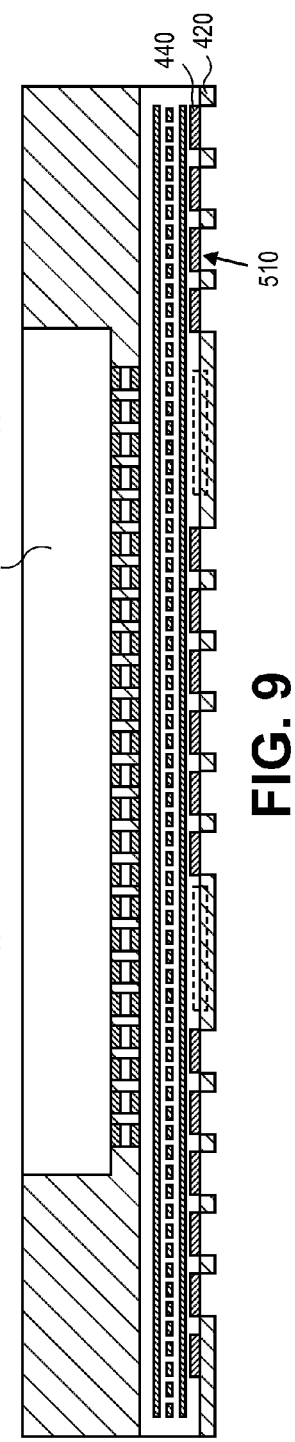
FIG. 9 shows the structure of FIG. 8 following the etching of openings or cavities through semiconductor substrate to contact pads.

FIG. 9 shows the structure of FIG. 8 following the etching of openings or cavities through semiconductor substrate 420 to contact pads 440. In one embodiment, a semiconductor substrate of, for example, silicon may be etched with a reactive ion etch to form the cavities. FIG. 9 also shows the structure following the removal of the masking layer.

Figure 10:
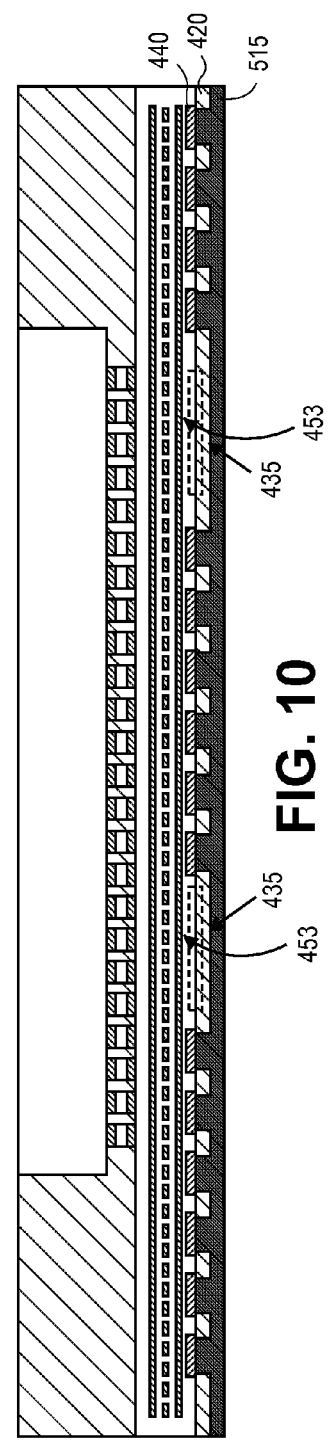
FIG. 10 shows the structure of FIG. 9 following the introduction of an optional barrier layer on the backside of the semiconductor substrate.

FIG. 10 shows the structure of FIG. 9 following the introduction of an optional barrier layer on the backside of the semiconductor substrate. FIG. 10 shows barrier layer 515 deposited as a blanket over the backside of semiconductor substrate. In one embodiment, a suitable material for barrier layer 515 is tantalum nitride (TaN). One deposition technique is a chemical vapor deposition, another is atomic layer deposition.

FIG. 11 shows the structure of FIG. 10 following the formation of openings through a material for barrier layer 515 to contact pads 440. In one embodiment, a process to form the openings includes the introduction of a masking material on barrier layer with openings to areas above the contact pads and followed by a reactive via etch through the barrier material to the contact pads and subsequent removal of the masking material. In one embodiment, following the patterning of the barrier layer and removal of the masking layer, a dielectric layer may be conformally introduced as a blanket across the substrate and patterned similar to the barrier layer.

FIG. 12 shows the structure of FIG. 11 following the introduction of solder connections to the contact pads. FIG. 12 shows solder connection 520 of, for example, tin-based solder introduction to contact pads 440. Following the introduction of solder connections, the structure may be singulated from, for example, other structures formed on the substrate base (e.g., singulated from a wafer). Following the introduction of solder connections 520, the structure may be connected to a substrate, such as a package substrate.

Figure 13:
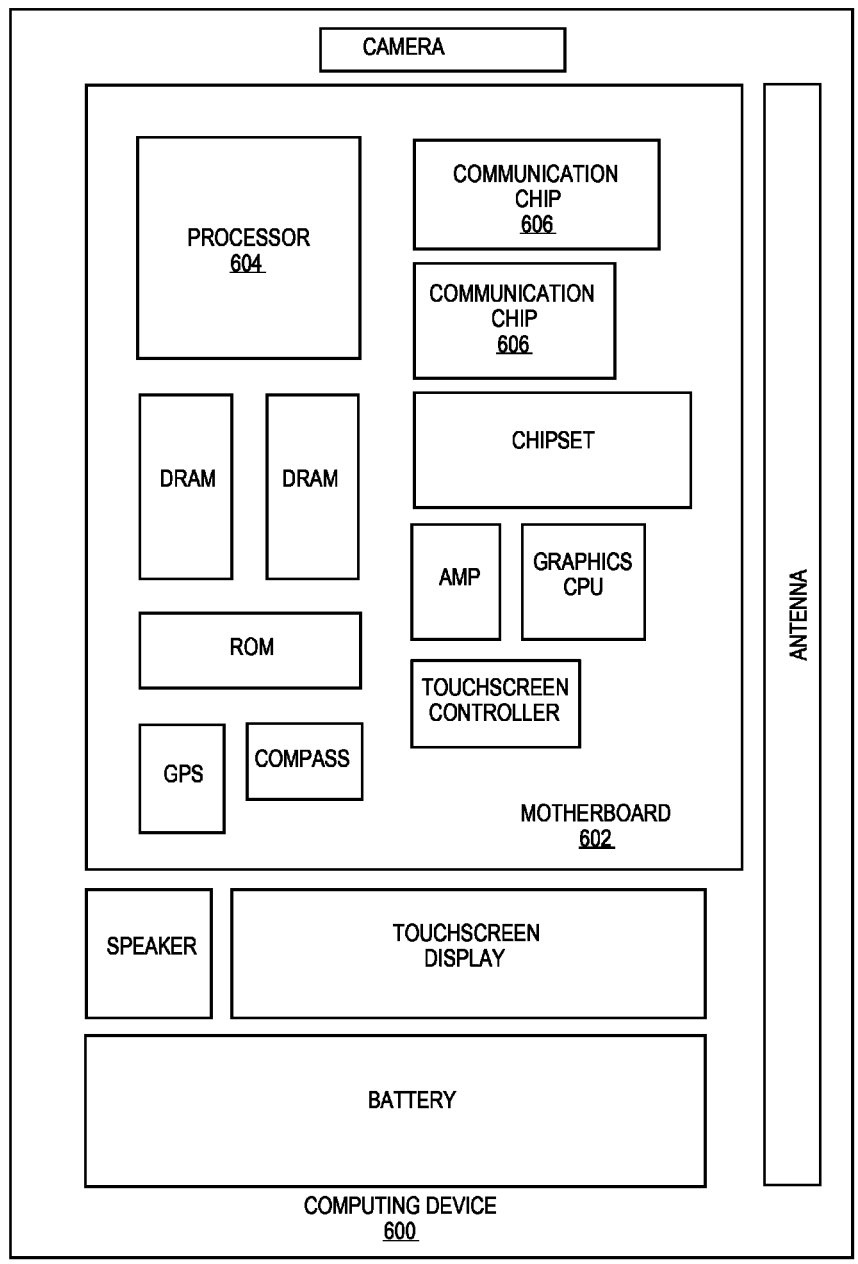
FIG. 13 illustrates the computing device in accordance with one implementation.

FIG. 13 illustrates computing device 600 in accordance with one implementation. Computing device 600 houses board 602. Board 602 may include a number of components, including but not limited to processor 604 and at least one communication chip 606. Processor 604 is physically and electrically coupled to board 602. In some implementations at least one communication chip 606 is also physically and electrically coupled to board 602. In further implementations, communication chip 606 is part of processor 604.

Depending on its applications, computing device 600 may include other components that may or may not be physically and electrically coupled to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, first communication chip 606 may be dedicated to shorter range wireless communications such as Wi-Fi and Bluetooth and second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the package includes an integrated circuit die connected to a space transformer where the space transformer has an active device/circuitry region such as described above. The term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, the package includes an integrated circuit die connected to a space transformer where the space transformer has an active device/circuitry region such as described above.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

Example 1 is an apparatus including a planar semiconductor substrate including a plurality of devices and a first pattern of electrical contacts formed on the first surface of the semiconductor substrate; and a plurality of layers of conductive material alternating between dielectric material on the first surface of the semiconductor substrate, the plurality of layers of conductive material including a wiring layer including a second pattern of electrical contacts, wherein the second surface of the semiconductor substrate includes openings to the first pattern of electrical contacts.

In Example 2, the first pattern of electrical contacts in the apparatus of Example 1 includes a first pitch and the second plurality of contacts include a second pitch and the first pitch is greater than the second pitch.

In Example 3, the plurality of devices in the apparatus of Example 1 are operable to perform a task related to at least one of high speed input/output, radio frequency, or power delivery.

In Example 4, the thickness of the semiconductor substrate in the apparatus of Example 1 includes less than about 25 microns.

In Example 5, the apparatus of Example 1 further includes at least one of a diffusion barrier layer and an insulation layer disposed on the second surface of the semiconductor substrate.

In Example 6, the semiconductor substrate in the apparatus of Example 1 includes a narrow band gap semiconductor material including silicon.

In Example 7, the semiconductor substrate in the apparatus of Example 1 includes a wide band gap semiconductor material.

In Example 8, the apparatus of Example 1 further includes a die coupled to one of the first pattern of electrical contacts and the second pattern of electrical contacts.

Example 9 is an apparatus, including a space transformer including a semiconductor substrate including a plurality of devices and a first pattern of electrical contacts on a first side of the semiconductor substrate and a plurality of layers of conductive material alternating between dielectric material on the first side of the semiconductor substrate, the plurality of layers of conductive material including a first wiring layer including a second pattern of electrical contacts; and at least one integrated circuit chip mounted on one of the first side and the second side of the semiconductor substrate.

In Example 10, a second side of the semiconductor substrate in the apparatus of Example 9 includes openings to the first pattern of electrical contacts.

In Example 11, the first pattern of electrical contacts in the apparatus of Example 9 includes a first pitch and the second pattern of contacts include a second pitch and the first pitch is greater than the second pitch.

In Example 12, the plurality of devices in the apparatus of Example 9 are operable to perform a task related to at least one of high speed input/output, radio frequency, or power delivery.

In Example 13, the thickness of the semiconductor substrate in the apparatus of Example 9 includes less than about 25 microns.

In Example 14, the apparatus of Example 9 further includes at least one of a diffusion barrier layer and an insulation layer disposed on a second surface of the semiconductor substrate.

In Example 15, the semiconductor substrate in the apparatus of Example 9 includes a narrow band gap semiconductor material including silicon.

In Example 16, the semiconductor substrate in the apparatus of Example 9 includes a wide band gap semiconductor material.

In Example 17, the apparatus of Example 9 further includes a package substrate coupled to the other of the first side and the second side of the semiconductor substrate.

Example 18 is a method including forming openings through a semiconductor substrate of a space transformer to a first pattern of electrical contacts on the semiconductor substrate, the space transformer including an interconnect stack on the semiconductor substrate, the interconnect stack including at least one routing layer and a pad layer including a second pattern of electrical contacts; and coupling an integrated circuit chip to one of the first pattern of electrical contacts and the second pattern of electrical contacts.

In Example 19, the method of Example 18 further includes forming a barrier layer on the semiconductor substrate.

In Example 20, the method of Example 18 further includes forming solder bumps on the first pattern of electrical contacts.

In Example 21, the method of Example 20 further includes coupling the solder bumps to contacts of a package.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
    a planar semiconductor substrate comprising a plurality of devices comprising transistors formed therein and a first pattern of electrical contacts formed on a first surface of the semiconductor substrate; and
    a plurality of layers of conductive material alternating between dielectric material on the first surface of the semiconductor substrate, the plurality of layers of conductive material comprising a wiring layer comprising a second pattern of electrical contacts,
    wherein a second surface of the semiconductor substrate comprises openings to the first pattern of electrical contacts.

2. The apparatus of claim 1, wherein the first pattern of electrical contacts comprises a first pitch and the second plurality of contacts comprise a second pitch and the first pitch is greater than the second pitch.

3. The apparatus of claim 1, wherein the plurality of devices are operable to perform a task related to at least one of high speed input/output, radio frequency, or power delivery.

4. The apparatus of claim 1, wherein the thickness of the semiconductor substrate comprises less than about 25 microns.

5. The apparatus of claim 1, further comprising at least one of a diffusion barrier layer and an insulation layer disposed on the second surface of the semiconductor substrate.

6. The apparatus of claim 1, wherein the semiconductor substrate comprises a narrow band gap semiconductor material including silicon.

7. The apparatus of claim 1, wherein the semiconductor substrate comprises a wide band gap semiconductor material.

8. The apparatus of claim 1, further comprising a die coupled to one of the first pattern of electrical contacts and the second pattern of electrical contacts.

9. An apparatus, comprising:
    a space transformer comprising a semiconductor substrate comprising on a first side thereof:
        a plurality of devices comprising transistors formed in the substrate,
        a first pattern of electric contacts, and
        a plurality of layers of conductive material alternating between dielectric material, the plurality of layers of conductive material comprising a wiring layer comprising a second pattern of electrical contacts; and
    at least one integrated circuit chip mounted on one of the first side and the second side of the semiconductor substrate.

10. The apparatus of claim 9, wherein a second side of the semiconductor substrate comprises openings to the first pattern of electrical contacts.

11. The apparatus of claim 9, wherein the first pattern of electrical contacts comprises a first pitch and the second pattern of contacts comprise a second pitch and the first pitch is greater than the second pitch.

12. The apparatus of claim 9, wherein the plurality of devices are operable to perform a task related to at least one of high speed input/output, radio frequency, or power delivery.

13. The apparatus of claim 9, wherein the thickness of the semiconductor substrate comprises less than about 25 microns.

14. The apparatus of claim 9, further comprising at least one of a diffusion barrier layer and an insulation layer disposed on a second surface of the semiconductor substrate.

15. The apparatus of claim 9, wherein the semiconductor substrate comprises a narrow band gap semiconductor material including silicon.

16. The apparatus of claim 9, wherein the semiconductor substrate comprises a wide band gap semiconductor material.

17. The apparatus of claim 9, further comprising a package substrate coupled to the other of the first side and the second side of the semiconductor substrate.

18. A method comprising:
    forming a space transformer comprising a semiconductor substrate comprising on a device side, a device region comprising devices comprising transistors formed in the semiconductor substrate, a first pattern of electrical contacts, and at least one routing layer and a pad layer comprising a second pattern of electrical contacts; and
    forming openings through the space transformer to the first pattern of electrical contacts on the semiconductor substrate.

19. The method of claim 18, further comprising forming a barrier layer on the semiconductor substrate.

20. The method of claim 18, further comprising forming solder bumps on the first pattern of electrical contacts.

21. The method of claim 20, further comprising coupling the solder bumps to contacts of a package.

22. The method of claim 18, further comprising coupling an integrated circuit chip to one of the first pattern of electrical contacts and the second pattern of electrical contacts.

* * * * *